United States Patent
Ishihara

(10) Patent No.: US 8,557,700 B2
(45) Date of Patent: Oct. 15, 2013

(54) METHOD FOR MANUFACTURING A CHIP-SIZE DOUBLE SIDE CONNECTION PACKAGE

(75) Inventor: Masamichi Ishihara, Kitakyushu (JP)

(73) Assignee: Invensas Corporation, San Jose, CA (US)

( * ) Notice: Subject to any disclaimer, the term of this patent is extended or adjusted under 35 U.S.C. 154(b) by 269 days.

(21) Appl. No.: 12/991,143

(22) PCT Filed: May 7, 2009

(86) PCT No.: PCT/JP2009/001998
§ 371 (c)(1),
(2), (4) Date: Nov. 5, 2010

(87) PCT Pub. No.: WO2009/136495
PCT Pub. Date: Nov. 12, 2009

(65) Prior Publication Data
US 2011/0057325 A1 Mar. 10, 2011

(30) Foreign Application Priority Data
May 9, 2008 (JP) ................................ 2008-123445

(51) Int. Cl.
*H01L 21/44* (2006.01)
(52) U.S. Cl.
USPC .................................. 438/667; 257/E21.597
(58) Field of Classification Search
USPC .......... 257/774, 448, 621, 698, 700, E21.597; 438/667
See application file for complete search history.

(56) References Cited

U.S. PATENT DOCUMENTS

| 2008/0315372 A1* | 12/2008 | Kuan et al. ..................... 257/659 |
| 2009/0166811 A1* | 7/2009 | Fujii ............................. 257/621 |
| 2010/0102426 A1* | 4/2010 | Park et al. ..................... 257/686 |

FOREIGN PATENT DOCUMENTS

| JP | 2005-136187 A | 5/2005 |
| JP | 2006-210758 A | 8/2006 |
| JP | 2007-250561 A | 9/2007 |
| KR | 10-2007-0102481 | 10/2007 |
| WO | WO 2005101475 A1 | 10/2005 |

OTHER PUBLICATIONS http://www.casio-micronics.co.jp/product/w_csp.html, home page of Casio Micronics Co., Ltd., "W-CSP", Sep. 24, 2010.

* cited by examiner

*Primary Examiner* — Bilkis Jahan
(74) *Attorney, Agent, or Firm* — Lerner, David, Littenberg, Krumholz & Mentlik, LLP

(57) ABSTRACT

A low resistance metal is charged into holes formed in a semiconductor substrate to thereby form through electrodes. Post electrodes of a wiring-added post electrode component connected together by a support portion thereof are simultaneously fixed to and electrically connected to connection regions formed on an LSI chip. On the front face side, after resin sealing, the support portion is separated so as to expose front face wiring traces. On the back face side, the semiconductor substrate is grounded so as to expose tip ends of the through electrodes. The front face wiring traces exposed to the front face side and the tip ends of the through electrodes exposed to the back face side are used as wiring for external connection.

4 Claims, 10 Drawing Sheets

SINGLE CHIP

ENLARGED VIEW OF SINGLE CHIP

BONDING PAD REGION

X — X'

SILICON SUBSTRATE    LSI REGION

X-X' CROSS-SECTIONAL VIEW

BONDING PAD REGION    LSI REGION

FRONT FACE

BACK FACE    SILICON SUBSTRATE    BONDING PAD REGION

OPENING FOR THROUGH ELECTRODE

CHARGING OF
LOW RESISTANCE METAL

BONDING PAD
REGION

LSI CHIP

THROUGH
ELECTRODE

UNIT STRUCTURE

CONNECTED STRUCTURE (a) APPLICATION OF RESIST

PHOTORESIST
MOTHER DIE (b) PATTERNING

PHOTORESIST PATTERN (c) PLATING

PLATING METAL (d) FLATTENING

FLAT SURFACE (e) REMOVAL OF RESIST

REMOVAL OF RESIST (f) SEPARATION

PLATING METAL

METHOD FOR MANUFACTURING A CHIP-SIZE DOUBLE SIDE CONNECTION PACKAGE

TECHNICAL FIELD

The present invention relates to a chip-size double side connection package in which a semiconductor chip is connected to wiring for external connection provided on each of first and second main faces respectively located above and blow the semiconductor chip, and to a method for manufacturing the same.

BACKGROUND ART

A chip-size package (CSP) refers to an ultra small package whose smallness and thinness are rendered close to those of an LSI chip to a possible degree. A wafer level chip size package (WLCSP) is known as an ultra small package which is fabricated by means of connecting individual LSIs of a wafer and corresponding electrodes and molding them with resin before the wafer is diced into the individual LSIs (separation); i.e., an ultra small package fabricated through direct packaging on a wafer (see Non-patent Document 1). In Patent Document 1, a double side electrode package which enables different similar packages to be disposed above and below the package in a stacked condition is disclosed as such a wafer level chip size package.

FIG. 16 shows a conventional double side electrode package disclosed in Patent Document 1. A multilayer wiring section is formed on the front face of a semiconductor substrate on which circuit elements are formed. In a stage of forming this multilayer wiring section, holes are formed in the semiconductor substrate, and through electrodes to be connected to the multilayer wiring section are formed in the holes. A back face insulation layer is formed on the back face of the semiconductor substrate such that tip ends of the through electrodes are exposed. Furthermore, post electrodes are connected to the uppermost wiring layer of the multilayer wiring section, and the post electrodes are covered with a front face insulation layer.

Subsequently, on the front face side, bump electrodes are formed on the tip ends of the post electrodes exposed from the front face insulation layer, and, on the back face side, bump electrodes are formed on the tip ends of the through electrodes exposed from the back face insulation layer.

In such a chip-size double side electrode package, both the upper and lower faces are covered with respective insulation layers. This configuration facilitates tests, and allows other packages having similar structures to be freely combined and disposed above and below the chip-size double side electrode package. The area of a completed double side electrode package is small; i.e., completely equal to that of the original chip. In addition, since mounting such a package on a substrate is easy, the package is suitable for high density mounting. Because of this feature, employment of such a double side electrode package in products which is small in mounting space, such as cellular phones and digital cameras, has been spreading.

In general, a semiconductor manufacturing process is divided into a former stage for fabricating an LSI and a latter stage for packaging the LSI. There are a few manufacturers that specialize in the latter stage but can cover the former stage. Manufacture of a conventional wafer level chip size package (WLCSP) requires a process of performing rewiring, post electrode plating, etc. on a wafer; that is, requires facilities similar to those used in the former stage, and cannot be performed by use of only conventional facilities for the latter stage. Therefore, it has not been easy to provide bump electrodes for external connection at positions different from those of the tip ends of post electrodes exposed to the surface of an insulation layer.

PRIOR ART DOCUMENTS

Patent Documents

Patent Document 1: Japanese Patent Application Laid-Open (kokai) No. 2005-136187
Patent Document 2: Japanese Patent Application Laid-Open (kokai) No. 2006-210758

Non-Patent Document

Non-patent Document 1: http://www.casio-micronics.co.jp/product/w_csp.html, home page of Casio Micronics Co., Ltd. "W-CSP"

SUMMARY OF THE INVENTION

Problems to be Solved by the Invention

The present invention has been accomplished so as to solve the above-described problems. An object of the present invention is to provide a chip-size double side connection package which allows other packages having similar structures to be freely combined and disposed above and below the chip-size double side electrode package, and which can be manufactured in such a manner that processes which require facilities similar to those used in the former stage are put together off line in the form of a component. Thus, manufacturers dedicated for the latter stage can enter into manufacture of such packages without large investment, and can readily cope with a future market expansion.

Another object of the present invention is to enable, by simple means, provision of external electrodes at positions different from those of the tip ends of post electrodes.

Means for Solving the Problems

A chip-size double side connection package and a method for manufacturing the same according to the present invention have the following features. A semiconductor chip including a semiconductor substrate on which an LSI region and electrode connection regions are formed is connected to wiring for external connection provided on a first main face and to wiring for external connection provided on a second main face, the first and second main faces being located above and below the semiconductor chip, respectively. A wiring-added post electrode component is formed such that it includes not only post electrodes supported by a support portion but also front face wiring traces connected to the post electrodes. Holes corresponding to through electrodes are formed in the semiconductor substrate at the centers of the electrode connection regions or in the vicinity thereof. A low resistance metal is charged into each of the holes to thereby form the through electrodes. The plurality of post electrodes of the wiring-added post electrode component, which are coupled together by the support portion, are simultaneously fixed to and electrically connected to upper surface regions of the through electrodes or the electrode connection regions. On the first main face side, after resin is charged into a space between the semiconductor chip and the support portion, the support portion is separated so as to expose the front face wiring traces. On the second main face side, the semiconductor substrate is grounded so as to expose tip ends of the through electrodes. The front face wiring traces exposed to the first main face side and the tip ends of the through electrodes exposed to the second main face side are used as wiring for external connection.

External electrodes for external connection may be formed on the front face wiring traces so as to be connected thereto. Further, on the second main face side, a back face insulation layer may be applied to the ground semiconductor substrate such that the tip ends of the through electrodes are exposed, and external electrodes to be connected to the tip ends of the through electrodes may be formed.

Effect of the Invention

According to the present invention, for manufacture of a double side electrode package, which allows other packages having similar structures to be freely combined and disposed above and below the package, processes which require facilities similar to those used in the former stage can be put together off line in the form of a component.

Furthermore, according to the present invention, since the package has a shape similar to a bear chip, and opposite sides of the package can be covered with insulation layers, inspection can be performed thoroughly. In addition, it becomes easier to perform three-dimensional stacking after inspecting the chip-size packages thoroughly so as to confirm that each package is non-defective.

BRIEF DESCRIPTION OF THE DRAWINGS

FIGS. 1(A) to 1(C) are views showing a completed LSI wafer, wherein FIG. 1(A) shows a single wafer on which a plurality of chips are formed in a matrix pattern, FIG. 1(B) is an elongated LSI chip perspective view showing one chip extracted from FIG. 1(A), and FIG. 1(C) is a cross-sectional view taken along line X-X'.

FIGS. 4(A) to 4(C) are views showing the details of a wiring-added post electrode component in which post electrodes with wiring are connected together by means of a plate-shaped support portion, wherein FIGS. 4(A) and 4(B) show a side cross-sectional view and a perspective view, respectively, of a unit structure for a single package, and FIG. 4(C) is a perspective view of a structure in which a plurality of unit structures are connected together.

MODE FOR CARRYING OUT THE INVENTION

Figure 1A:
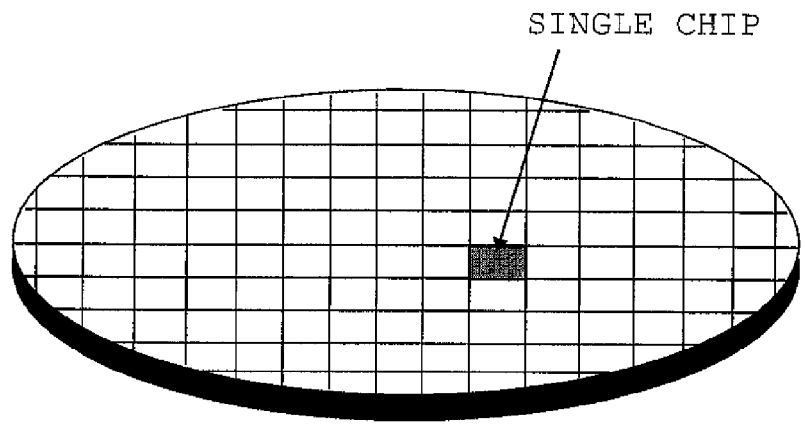
Figure 1B:
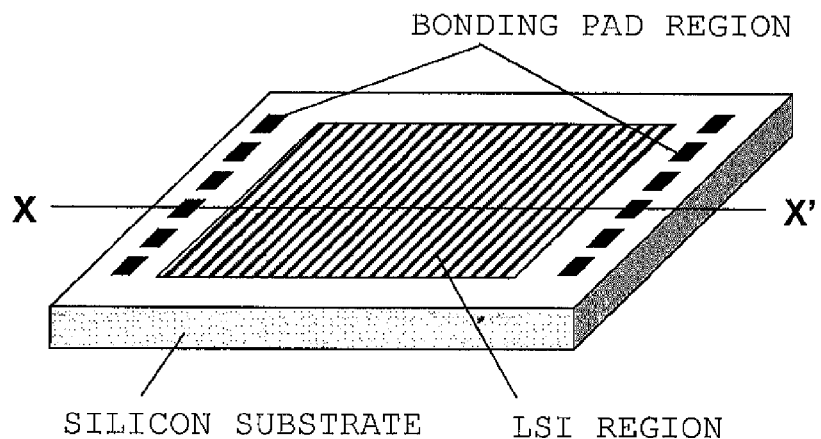
Figure 1C:
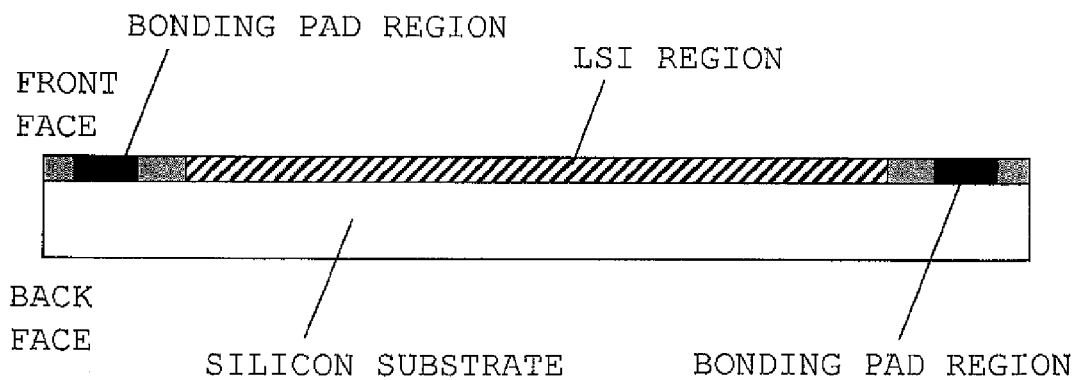

The present invention will now be described by way of example. A chip-size double side connection package according to a first embodiment of the present invention will be described in the order of its manufacturing steps with reference to FIGS. 1 to 10. FIGS. 1(A) to 1(C) are views showing a completed LSI wafer, wherein FIG. 1(A) shows a single wafer on which a plurality of chips are formed in a matrix pattern, FIG. 1(B) is an enlarged LSI chip perspective view showing a single chip extracted from FIG. 1(A), and FIG. 1(C) is a cross-sectional view taken along line X-X'. The LSI chip shown in FIGS. 1(B) and 1(C) is formed on a semiconductor (e.g., silicon) substrate by use of an ordinary semiconductor process technique. An LSI region including an active region and a wring region is formed on the upper surface of the silicon substrate, and a plurality of bonding pad regions to be connected to the LSI region are formed around the LSI region. Both or either of a through electrode and a post electrode to be described later is connected to each of the plurality of bonding pad regions (electrode connection potions). Notably, in the present specification, as shown in FIG. 1(C), the side of the LSI chip on which the silicon substrate is present will be referred to as the "rear face," and the side of the LSI chip on which the LSI region is present will be referred to as the "front face." Notably, an example in which, as will be described later, post electrodes are connected to upper surface regions of through electrodes electrically connected to the bonding pad regions is illustrated and described. However, the post electrodes can be connected simultaneously not only to the upper surface regions of the through electrodes but also the bonding pad regions by means of solder connection (e.g., solder reflow).

Figure 2:
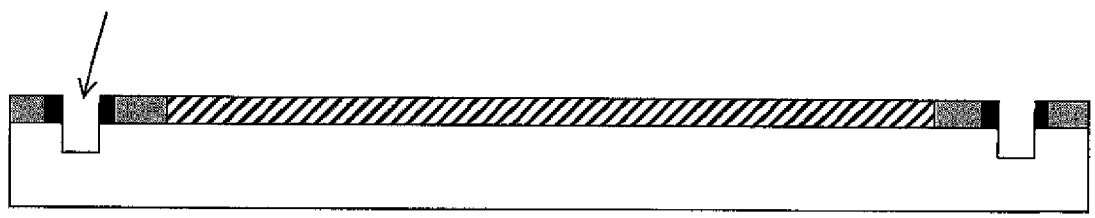
FIG. 2 is a view for describing a step of forming openings for through electrodes.

FIG. 2 is a view for describing a step of forming openings for through electrodes. At the center of each bonding pad region or in the vicinity thereof, a hole corresponding to a through electrode to be described later is formed to extend through the bonding pad region into the silicon substrate. For example, this hole has a diameter of about several µm to 30 µm, and a depth of about 5 to 50 µm. A low resistance metal is charged into the hole to thereby form the through electrode. However, before this, an insulation film is formed on the wall surface of each hole of the silicon substrate. Although the insulation film may be formed through thermal oxidation, it is desired to be formed through deposition at low temperature. Therefore, in the latter case, a nitride film is used as the insulation film. Such a nitride film is formed through deposition of a species produced as a result of a contact decomposing reaction of a source material on a heated catalyst (see Patent Document 2).

Figure 3:
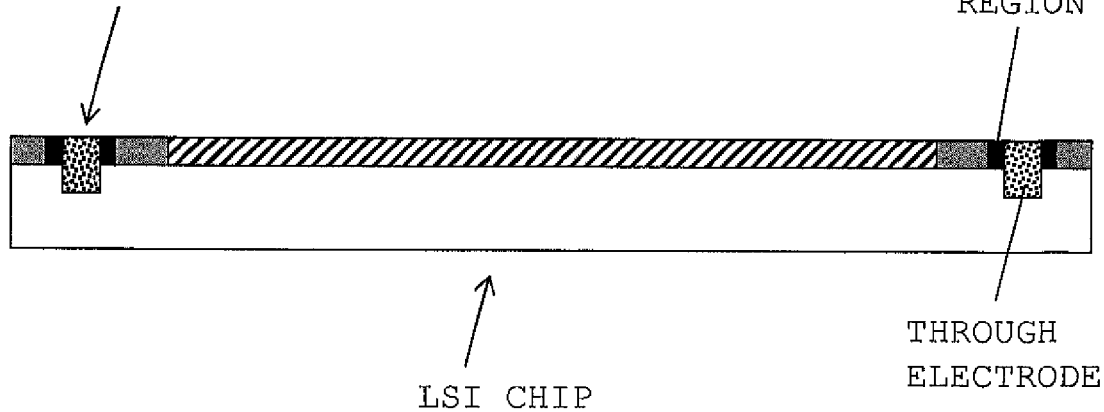
FIG. 3 is a view for describing charging of a low resistance metal.

FIG. 3 is a view for describing charging of a low resistance metal. Charging of a low resistance (electrically conductive metal) may be performed through plating. Alternatively, charging of such a low resistance metal may be performed by use of nanoparticles of metal (copper, silver, gold, etc.) and an ink jet method practically used in the field of printers. Thus, the low resistance charged metal (through electrode) is electrically connected to the corresponding bonding pad region as well.

Figure 4A:
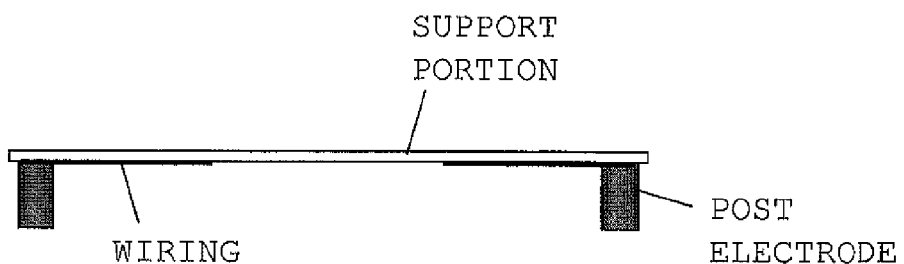
Figure 4B:
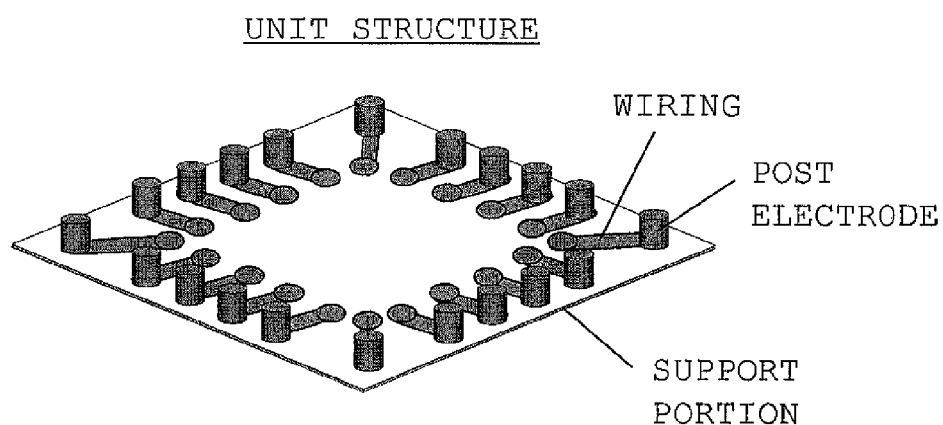
Figure 4C:
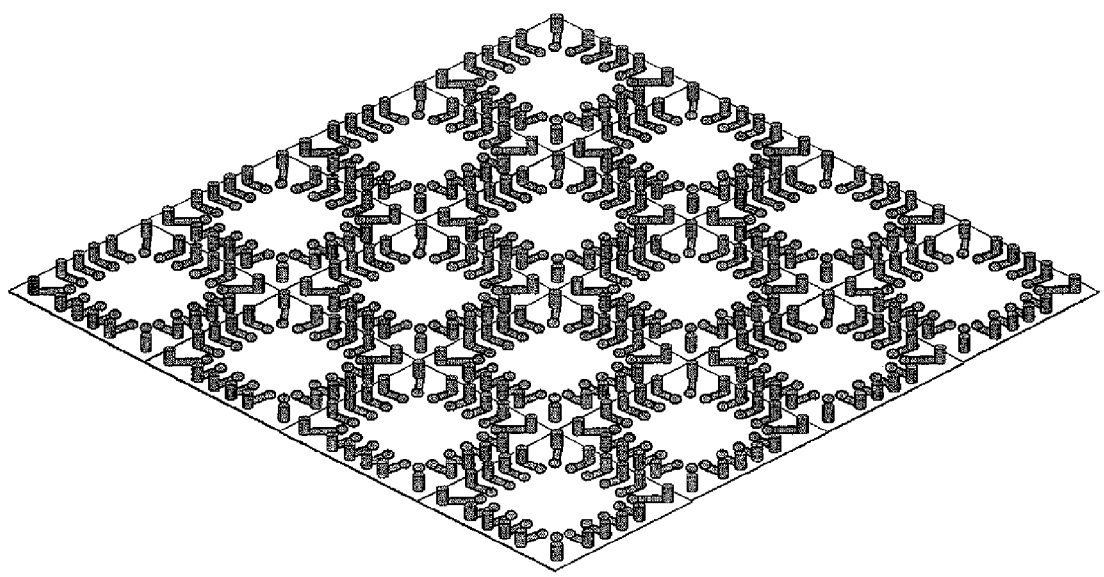

Next, manufacture of a wiring-added post electrode component will be described with reference to FIGS. 4(A) to 4(C). FIGS. 4(A) to 4(C) are views showing the details of a wiring-added post electrode component in which post electrodes with wiring are connected together by means of a plate-shaped support portion, wherein FIGS. 4(A) and 4(B) show a side cross-sectional view and a perspective view, respectively, of a unit structure for a single package, and FIG. 4(C) shows a perspective view of a structure in which a plurality of unit structures for a plurality of packages are connected together. Not only the post electrodes supported by the support portion but also wiring connected thereto is formed through electroforming.

The unit structure and the structure in which a plurality of unit structures are connected together are configured such that a plurality of post electrodes and wiring traces are connected together by a support portion on the back side. The shape of the post electrodes is not limited to the illustrated circular columnar shape, and the post electrodes may have any of other columnar (bar-like) shapes such as a rectangular columnar shape and a polygonal columnar shape. The wiring traces and the post electrodes are fabricated through electroforming.

Electroforming itself is well known. Electroforming is a "method of manufacturing, repairing, or replicating a metal product through electroplating," and is basically the same as electroplating. However, electroforming differs from electroplating in plating thickness, and also differs from electroplating in that an operation of separating a plating film is performed. Further, when a plating film is separated from a mother die and used, control and management of the physical properties of the plating film are important. A material including nickel, copper, a nickel alloy, or a copper alloy may be used in the present invention as a plating metal (conductive material) to be deposited by electroforming. Stainless steel, which is generally used as an electrically conductive material, may be used as the material of the mother die used in the present invention. Alternatively, the mother die may be formed of a silicon substrate which serves as a base and whose surface is covered with a thin oxide film or the like which allows passage of electricity for plating therethrough and which facilitates separation of a plating pattern. The composition of a plating bath and plating conditions must be selected such that no internal stress is produced. In the case of nickel plating, nickel sulfamate bath is used as a plating bath.

Figure 17:
FIG. 17 is a set of process charts showing a method of manufacturing an electroformed component by use of photoresist.
Figure 17:
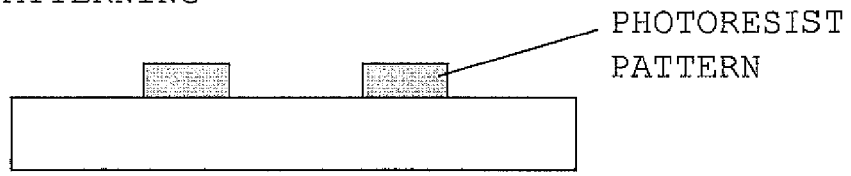
Figure 17:
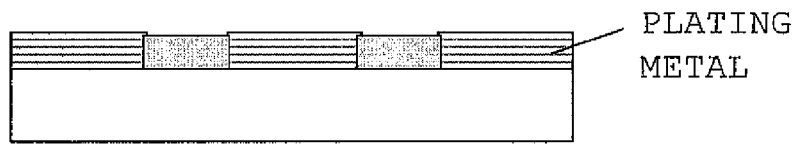
Figure 17:
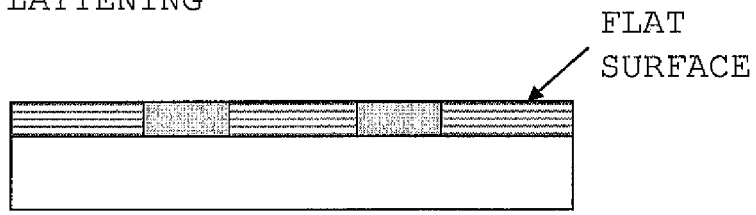
Figure 17:
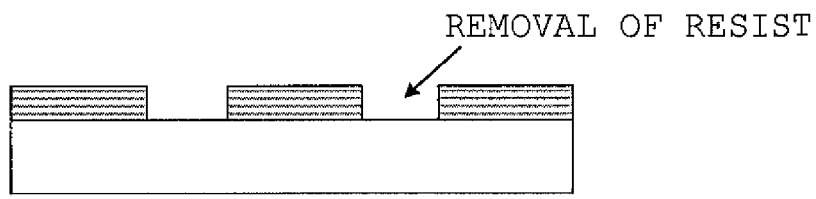
Figure 17:
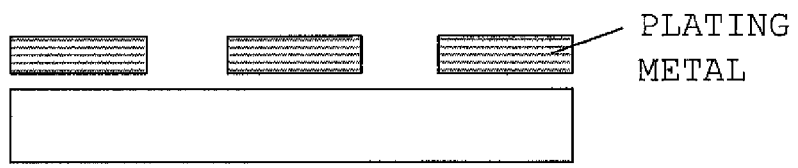

FIG. 17 is a set of process charts showing a method of manufacturing an electroformed component by use of photoresist. Although electroforming will be described below, the manufacturing steps shown in the process charts can be applied to plating (see FIG. 14). In the case of plating (electroless plating), in place of a conductor such stainless steel, an insulating member is used as a mother die, whereby the insulating member can be used as a protection film of a semiconductor device without being removed.

Electroforming is performed as follows. As shown in FIG. 17(a), photoresist (non-conductive film) is applied to an upper surface of a mother die of, for example, stainless steel. Subsequently, the photoresist is exposed to light through a pattern film to thereby form a pattern, followed by development, whereby an original plate for electroforming is formed (FIG. 17(b)). In the case of a chip-size double side connection package, the photoresist pattern of the original plate for electroforming has a thickness greater than that of a product (post electrodes or wiring traces). In the case of the post electrodes, the photoresist pattern has a thickness greater than the thickness of an IC chip; for example, a thickness of about 50 μm to 300 μm. Subsequently, a plating metal is deposited in opening portions of the photoresist pattern (FIG. 17(c)). An anode and a cathode are placed in a plating bath (e.g., nickel sulfamate solution) maintained at a proper temperature. The anode is formed of an electroforming metal to be deposited through electroforming. The cathode is an electroforming mother die of, for example, stainless steel. As shown in FIG. 17(c), a photoresist pattern is previously formed on the surface of the electroforming mother die serving as the cathode. When a current is caused to flow between the anode and the cathode, the electroforming metal of the anode melts, and is plated in the opening portions of the photoresist pattern on the electroforming mother die.

Next, as shown in FIG. 17(d), flattening machining is performed. Subsequently, the resist is removed (FIG. 17(e)), whereby the plating metal forms wiring traces or post electrodes. The wiring traces formed by the plating metal are then separated from the electroforming mother die (FIG. 17(f)). The feature of electroforming resides in that separation of the formed wiring traces and support portion can be readily performed by means of heat and pressure.

For manufacture of a wiring-added post electrode component illustrated in FIGS. 4(A) to 4(C), the steps shown in FIG. 17(a) to FIG. 17(d) are repeated two times. In the first step, wiring traces are formed on the support portion, and, in the second step, post electrodes to be connected to the wiring traces are formed.

As described above, in the manufacture of the wiring-added post electrode component, columnar post electrodes with wiring is grown on an electrically conductive material (ectroforming mother die), which is a support portion, by use of lithography and plating, whereby wiring-added post electrodes integrated with the support portion are formed. After that, the wiring-added post electrode component shown in FIGS. 4(A) to 4(C) is connected and fixed to the LSI chip shown in FIG. 3.

Figure 5:
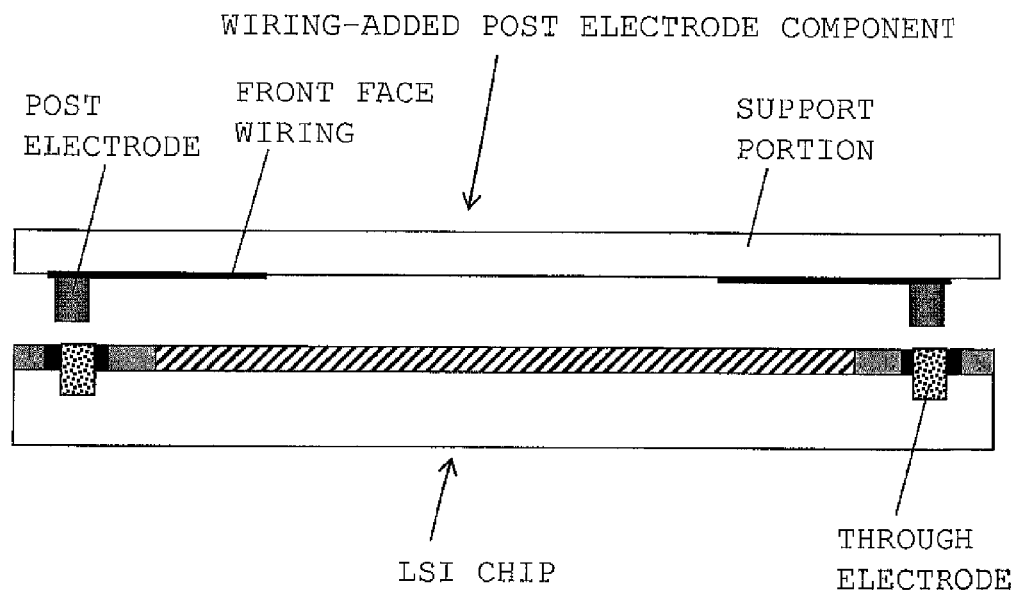
FIG. 5 is a view exemplifying a wiring-added post electrode component and an LSI chip in a state before they are connected together.

FIG. 5 is a view exemplifying a wiring-added post electrode component and an LSI chip in a state before they are connected together. The plurality of post electrodes of the wiring-added post electrode component are simultaneously fixed to and electrically connected to upper surface regions of the through electrodes formed in the LSI chip or the bonding pad regions. With this procedure, the wiring-added post electrode component is coupled to the front face side of the LSI chip. The fixation and connection of the post electrodes may be performed through solder connection. The post electrodes are simultaneously connected to the upper surface regions of the through electrodes or the bonding pad regions by means of performing solder connection (e.g., solder reflow). In a state after the post electrodes are connected to the upper surface regions of the through electrodes, all the post electrodes and the front face wiring are coupled together by means of the plate-shaped support portion.

Figure 6:
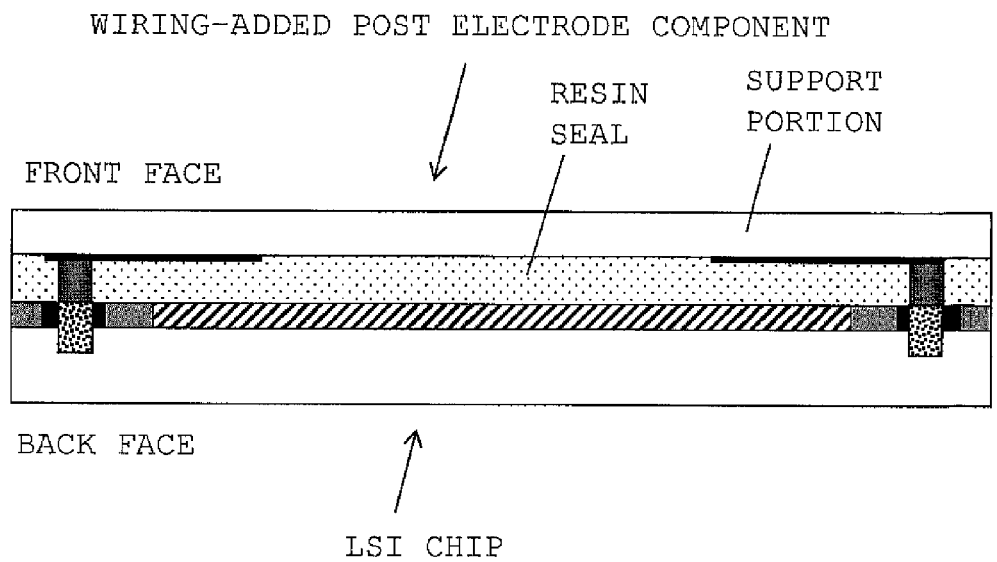
FIG. 6 is a view showing the wiring-added post electrode component and the LSI chip in a state in which the post electrode component is connected and fixed to the LSI chip, and resin-sealed.

FIG. 6 is a view showing the wiring-added post electrode component and the LSI chip in a state in which the post electrode component is connected and fixed to the LSI chip, and resin-sealed. After the wiring-added post electrode component, in which post electrodes with wiring are coupled together by a support portion, is fixed to the LSI chip, the front face of the LSI chip is transfer-molded up to the lower surface of the support portion (the above-described ectroforming mother die); i.e., transfer mold is performed such that the space between the LSI chip and the support portion is filled with resin. Alternatively, the front face of the LSI chip is resin-sealed by use of liquid resin (the material is, for example, an epoxy resin).

Figure 7:
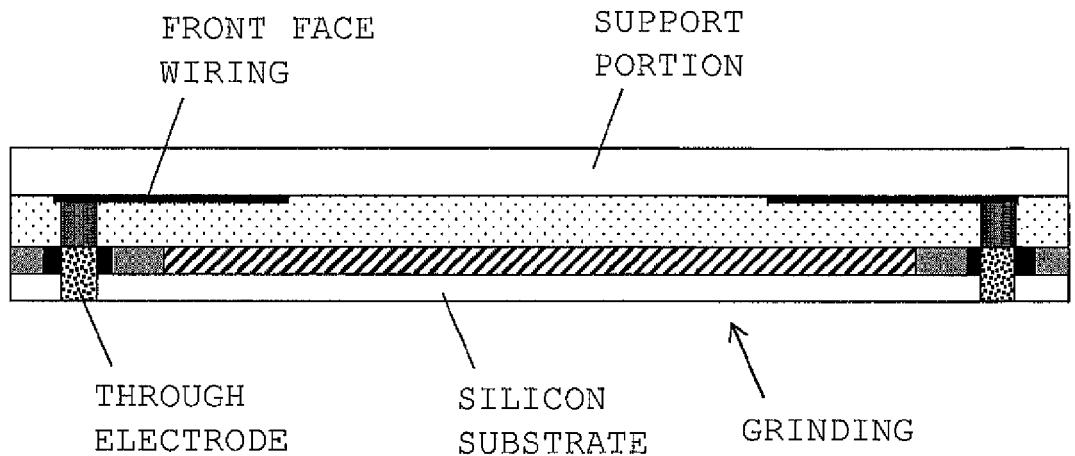
FIG. 7 is a view for describing grinding of a silicon substrate.

FIG. 7 is a view for describing grinding of a silicon substrate. The back face side of the silicon substrate is ground such that tip ends of the through electrodes are exposed to the outside. As a result of the grinding, the thickness of the silicon substrate becomes about 25 μm. Even though the silicon substrate becomes thin as described above, the strength of the overall wafer can be maintained because the wiring-added post electrode component fixed to the LSI chip increases the rigidity of the wafer. Thus, it is possible to prevent damage to the silicon substrate, such as cracking or breakage thereof, which damage would otherwise occur during handling of the silicon substrate.

Figure 8:
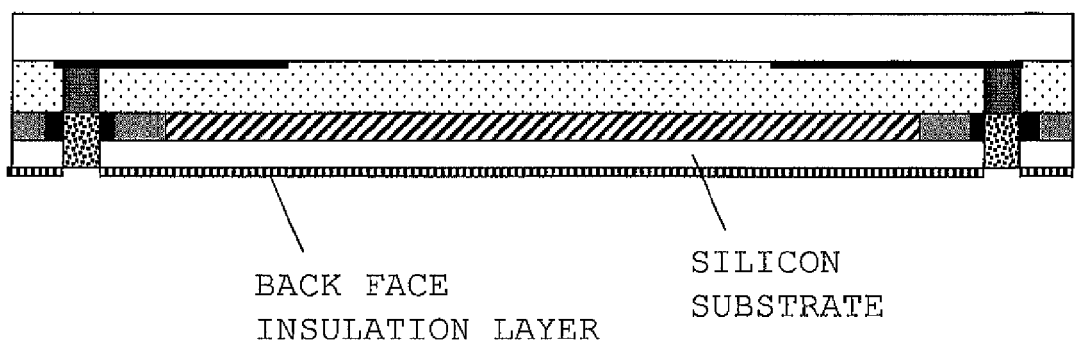
FIG. 8 is a view for describing application of a back face insulation layer.

FIG. 8 is a view for describing application of a back face insulation layer. A back face insulation layer is formed on a silicon surface on the back face side of the silicon substrate. At that time, for example, an insulating material (e.g., an epoxy material) is applied to the silicon surface by an ink jet method, excluding areas corresponding to the through electrodes. Alternatively, after the insulating material is applied to the entire surface, holes are formed at positions corresponding to the through electrodes, whereby the tip ends of the through electrodes are exposed. The thickness of the back face insulation layer is determined such that the back face insulation layer can provide at least electrical insulation.

Figure 9:
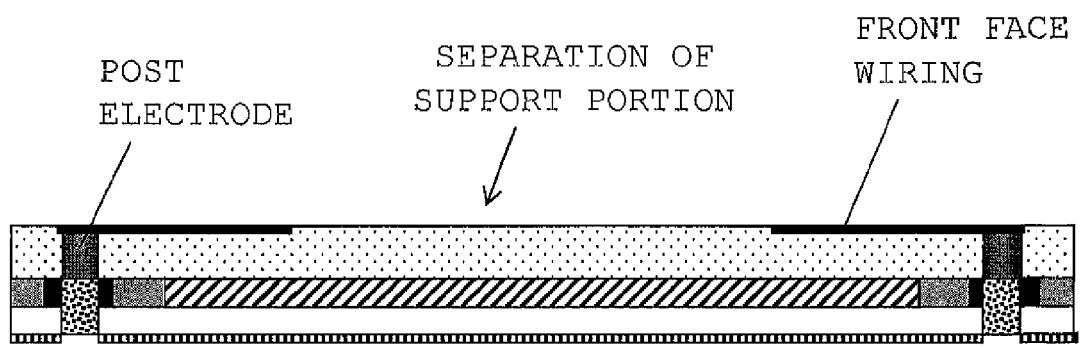
FIG. 9 is a view showing a state after separation of a support portion (electroforming mother die).

FIG. 9 is a view showing a state after separation of the support portion (electroforming mother die). Through separation of the support portion, the plurality of post electrodes (and the front face wiring traces connected thereto) are electrically separated from one another. The device in this state can be used as a completed chip-size double side connection package in which the exposed front face wiring traces and the exposed tip ends of the through electrodes can be used as wiring traces for external connection and electrodes for external connection on the front face and the back face, respectively.

Figure 10:
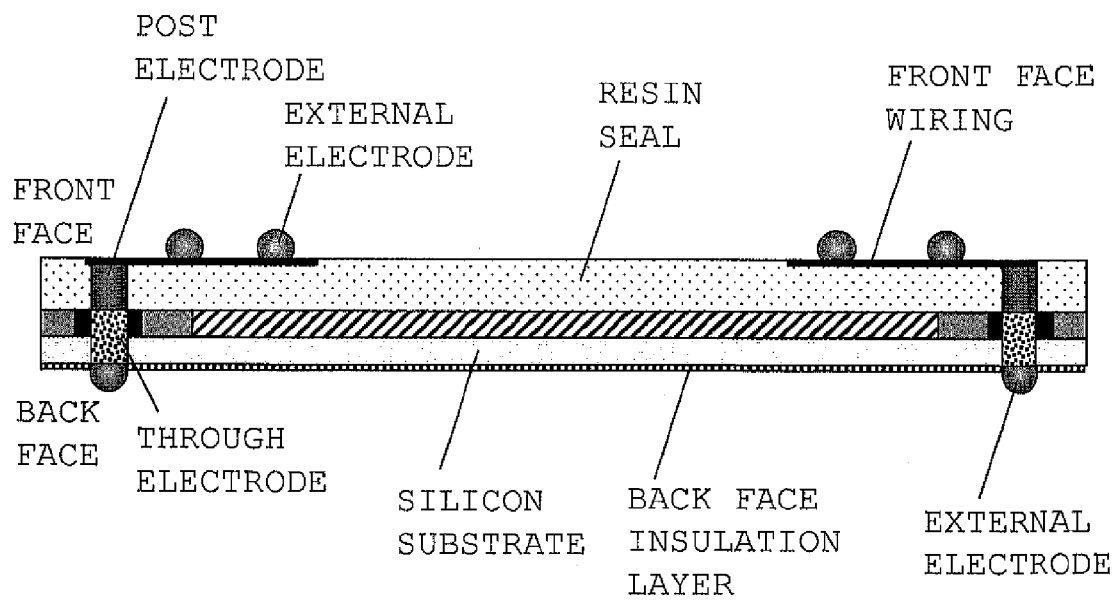
FIG. 10 is a view showing a chip-size double side connection package having bump electrodes formed thereon.

FIG. 10 is a view showing a chip-size double side connection package having bump electrodes formed thereon. On the front face side, external electrodes for external connection (bump electrodes) are formed on the front face wiring traces exposed through separation of the support portion to be connected therewith. If necessary, a protection film (the material is, for example, solder resist) for protecting the upper surfaces of the front face wiring traces may be formed. In such a case, holes are formed in the protection film, and external electrodes are formed there. On the back face side as well, holes are formed in the back face insulation layer at locations where external electrodes (bump electrodes) must be formed, and external electrodes are formed at such locations. After that, the wafer is diced so as to separate LSIs from one another. Alternatively, the wafer may be diced before formation of external electrodes. In manufacture of semiconductor devices, in general, a semiconductor wafer having a wide area is prepared, then undergoes various processes, and finally diced vertically and horizontally to thereby form a large number of semiconductor elements (semiconductor chips). Thus, the chip-size double side connection package is completed.

As described above, according to the present invention, processes for forming rewiring and post electrodes of a chip-size double side connection package can be put together in the form of a wiring-added post electrode component. A conventional wiring layer is formed on the surface of an LSI chip. In contrast, according to the present invention, a wiring layer can be easily formed in a spacious region of the surface of a seal resin portion located outward of the post electrodes.

Figure 11:
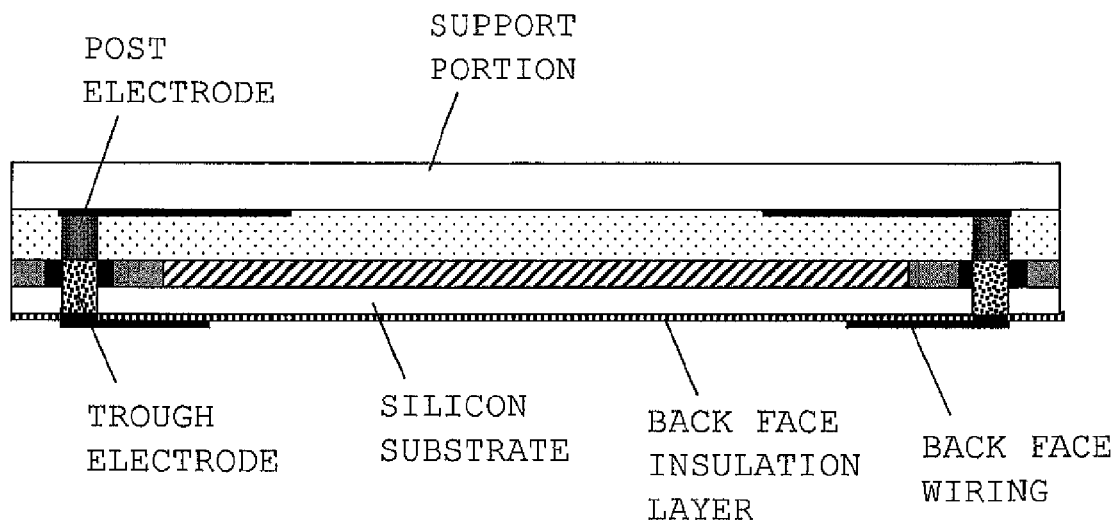
FIG. 11 is a view for describing formation of back face wiring (re-wiring) connected to the exposed ends of through electrodes.

Next, a chip-size double side connection package according to a second embodiment will be described with reference to FIGS. 11 to 13. After the back face insulation layer is applied to the back face of the silicon substrate excluding areas corresponding to the tip ends of the through electrodes as shown in FIG. 8, there are formed back face wiring traces (rewiring) to be connected to the exposed ends of the through electrodes as shown in FIG. 11. The back face wiring traces may be metal particle wiring traces formed by use of metal nanoparticles. The metal particle wiring traces are formed by means of directly patterning a wiring layer; i.e., applying metal nanoparticles by a direct depicting method such as an ink jet method or a screen printing method. A desired pattern is depicted by means of applying organic solvent containing nanoparticles of metal (copper, silver, gold, etc.) by an ink jet method practically used in the field of printers. After that, heat treatment is performed so as to evaporate the organic solvent. Alternatively, in the case of the screen printing method, nanoparticle paste prepared by adding metal nanoparticles to organic solvent is applied onto the back face insulation layer by the screen printing method, followed by heating and firing, whereby circuit wiring can be formed. After this rewiring process performed through formation of metal particle wiring, a process for lowering the resistance may be performed along with removal of the solvent (see Patent Document 2).

Figure 12:
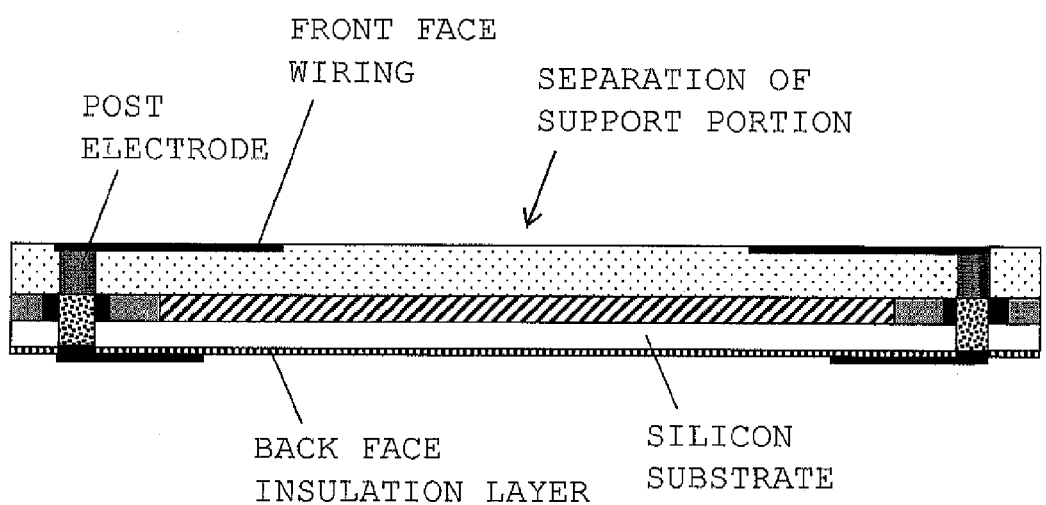
FIG. 12 is a view showing a state after separation of a support portion (electroforming mother die).

FIG. 12 is a view showing a state after separation of the support portion (electroforming mother die). As a result of separation of the support portion, the plurality of post electrodes (and the front face wiring traces connected thereto) are electrically separated from one another.

Figure 13:
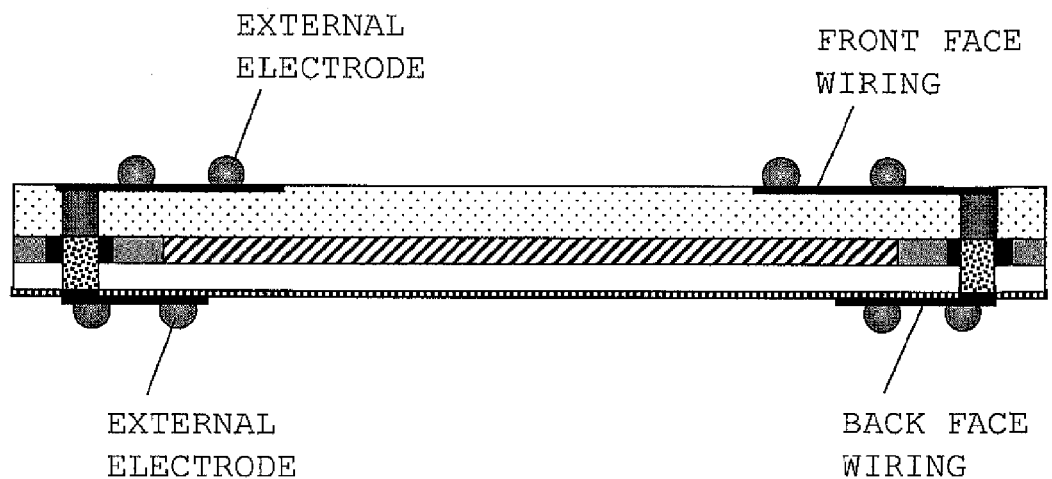
FIG. 13 is a view showing a chip-size double side connection package having bump electrodes formed thereon.

FIG. 13 is a view showing a chip-size double side connection package having bump electrodes formed thereon. The device in a state shown in FIG. 12 can be used as a completed chip-size double side connection package. However, on the front face side, as in the case described with reference to FIG. 10, external electrodes for external connection (bump electrodes) may be formed on the wiring traces, exposed through separation of the support portion, to be connected therewith. On the back face, external electrodes (bump electrodes) are formed such that they are connected to the back face wiring traces. If necessary, on the front face or the back face, there may be formed a protection film (formed through application of insulation film or solder resist) for protecting the upper surfaces of the wiring traces. In such a case, holes are formed in the protection film, and external electrodes are formed there.

Figure 14A:
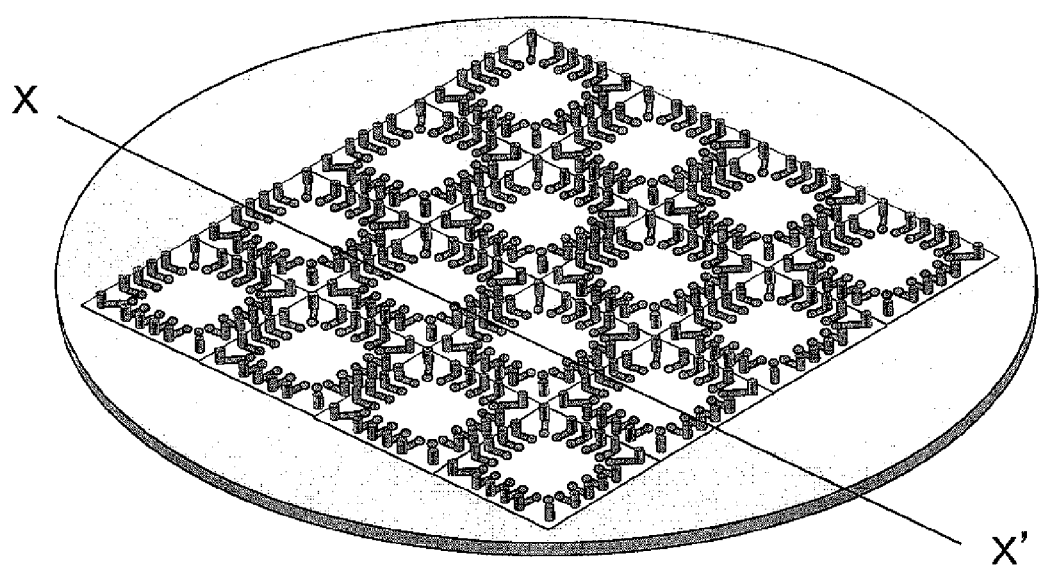
FIG. 14(A) is a perspective view showing a plurality of wiring-added post electrode components connected together.
Figure 14B:
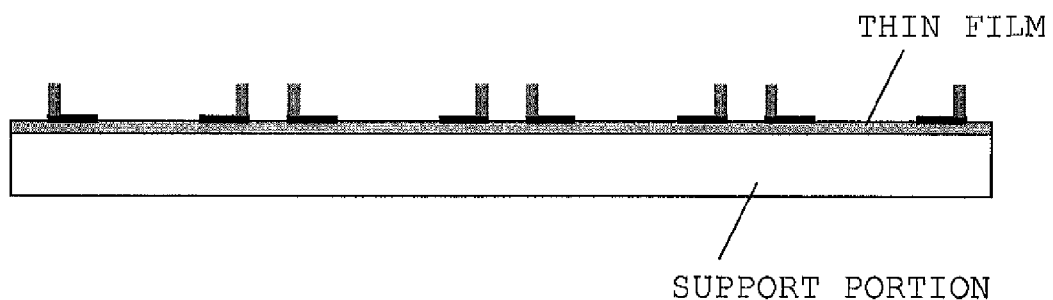
FIG. 14(B) is a cross-sectional view taken along line X-X' in FIG. 14(A).

FIGS. 14(A) and 14(B) are views showing a wiring-added post electrode component different from that shown in FIGS. 4(A) to 4(C). FIG. 14(A) is a perspective view showing a plurality of s connected together, and FIG. 14(B) is a cross-sectional view taken along line X-X' in FIG. 14(A).

Stainless steel (SUS) may be used for the support portion of the wiring-added post electrode component. However, in the case where stainless steel is used, difference in coefficient of thermal expansion between the support portion and the silicon substrate may cause a positional shift between post electrode connection positions on the wafer and the positions of the post electrodes supported by the stainless steel. In this case, desirably, a silicon substrate which is equal in thermal expansion to the above-mentioned silicon substrate or a glass substrate which is low in coefficient of thermal expansion is used.

In the case of the illustrated support portion, a tape formed from an insulation material in the form of a thin film, whose typical example is polyimide tape, is applied to the entirety of one face of the support portion. The support portion and the tape are separated from each other in a later step. Therefore, a treatment is performed in advance which treatment facilitates separation between the support portion and the tape upon application of, for example, a temperature higher than reflow temperature (equal to or higher than mold temperature). For example, adhesive containing thermal capsules is used. Alternatively, the support portion is formed of a light transmissible material (e.g., heat resistance glass which is low in thermal expansion), and an ultraviolet-ray-separation-type adhesive is used. Alternatively, a thermoplastic adhesive may be used.

Moreover, a metal seed layer which will become wiring traces is formed on this tape, whereby a metal-clad tape is formed. The seed layer may be formed of foil of gold, silver, copper, or palladium, which can be copper-plated. The wiring traces are formed through a process in which resist is applied to the seed layer, patterning is performed through exposure and development, etching is performed, and the resist is removed. A wiring layer is grown on this seed layer through plating. Furthermore, for formation of the post electrodes, application of resist and development are carried out thereon, and post portions are grown through plating. Alternatively, the wiring traces may be formed by means of directly patterning the seed layer by use of metal nanoparticles. In this case, the lithography step can be omitted (see the above-described meal particle wiring). Alternatively, it is possible to apply a copper-foil-clad tape, and form wiring traces through etching. Furthermore, for formation of the post electrodes, application of resist and development are carried out thereon, and post portions are grown through plating. Thus, the wiring-added post electrode component is completed.

Figure 15:
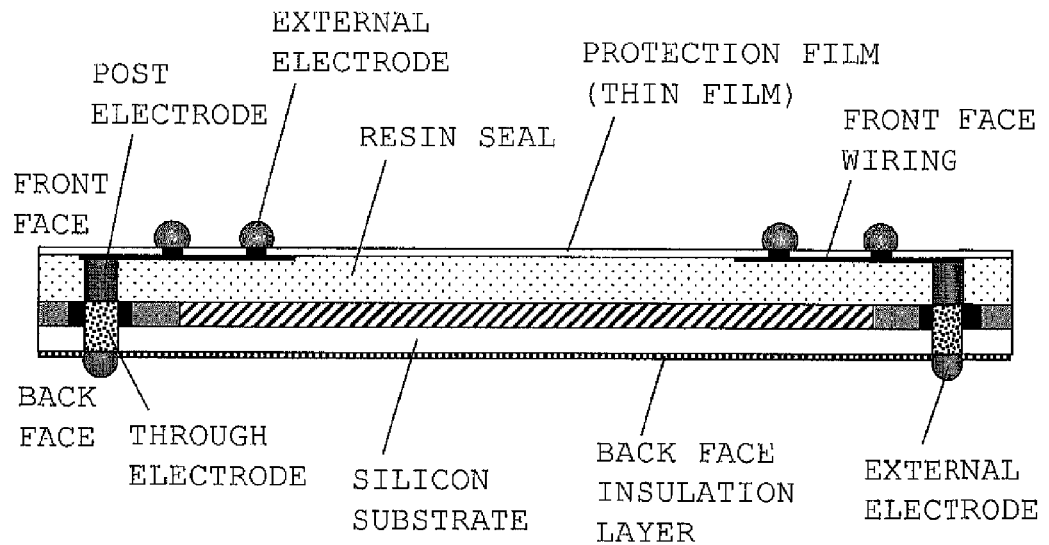
FIG. 15 is a view exemplifying a chip-size double side connection package according to a third embodiment.
Figure 16:
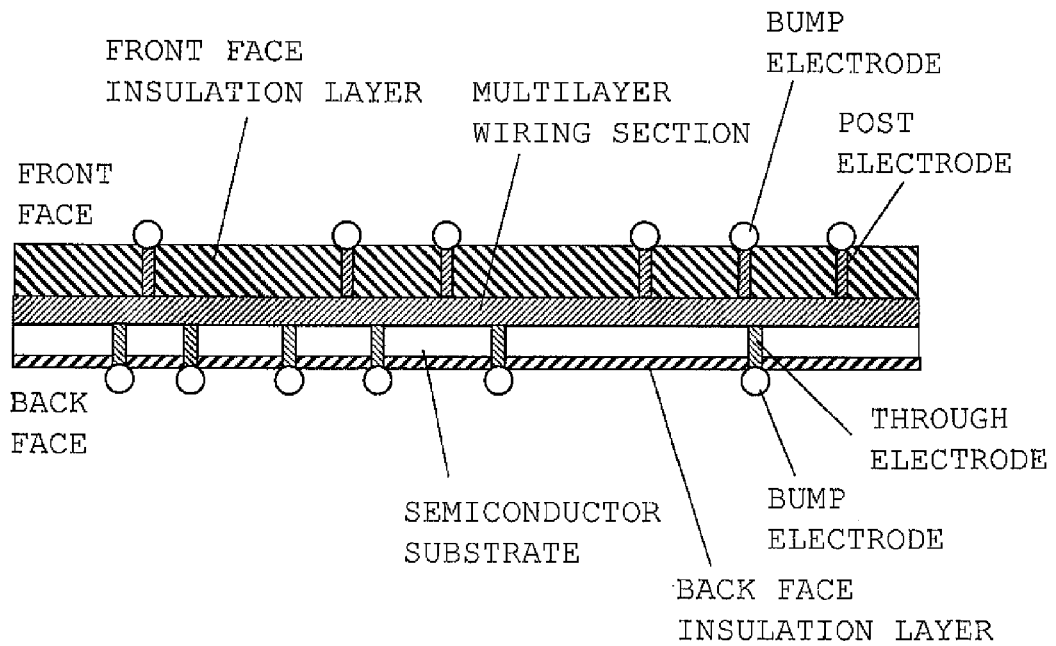
FIG. 16 is a view showing a conventional double side electrode package.

FIG. 15 is a view exemplifying a chip-size double side connection package according to a third embodiment. FIG. 15 corresponds to FIG. 10 and shows a chip-size double side connection package which can be obtained through addition of a protection film (thin film) to the chip-size double side connection package illustrated in FIG. 10. The wiring-added post electrode component illustrated in FIGS. 14(A) and 14(B) is connected and fixed to the LSI chip as in the above-described case. After that, for separation of the support portion, a predetermined high temperature is applied such that only the support portion is separated and the insulation tape of thin film remains. The exposed insulation tape functions as a protection film of a completed product. After that, on the front face side, holes are formed in the protection film, and external electrodes are formed to be connected to the front face wiring traces exposed through formation of the holes. Thus, the chip-size double side connection package according to the third embodiment is completed. Similarly, the wiring-added post electrode component illustrated in FIGS. 14(A) and 14(B) may be applied to the chip-size double side connection package according to the second embodiment (see FIGS. 11 to 13), whereby the chip-size double side connection package according to the second embodiment can have a thin film functioning as a protection film.

Although only some exemplary embodiments of the present invention have been described in detail above, many modifications are possible in the exemplary embodiments without materially departing from the novel teachings and advantageous effects of the present invention.

The invention claimed is:

1. A method for manufacturing a chip-size double side connection package configured such that a semiconductor chip including a semiconductor substrate on which a LSI region and electrode connection regions are formed is connected to wiring for external connection provided on a first main face and to wiring for external connection provided on a second main face, the first main face and the second main face being located above and below the semiconductor chip, respectively, the method comprising:

forming a wiring-added post electrode component having a plurality of post electrodes connected to the electrode connection regions, a plurality of wiring traces respectively connected to the plurality of post electrodes, and an insulation tape of thin film provided on the back side of the plurality of post electrodes and the wiring traces, supported by a support portion;

simultaneously fixing and electrically connecting the plurality of post electrodes of the wiring-added post electrode component, which are coupled together by the support portion, to the electrode connection regions;

charging resin into a space between the LSI region and the insulation tape, and then separating the support portion so as to expose the insulation tape acting as a protection film, wherein, on the first main face, the plurality of wiring traces connected to the plurality of post electrodes are used as the wiring for external connection and on the second main face, tip ends of through electrodes formed to pass through the semiconductor substrate are used as the wiring for external connection.

2. A chip-size double side connection package configured such that a semiconductor chip including a semiconductor substrate on which a LSI region and electrode connection regions are formed is connected to wiring for external connection provided on a first main face and to wiring for external connection provided on a second main face, the first main face and the second main face being located above and below the semiconductor chip, respectively, the chip-size double side connection package comprising:

a plurality of post electrodes connected to the electrode connection regions;

a plurality of wiring traces respectively connected to the plurality of post electrodes;

an insulation tape of thin film provided on the back side of the plurality of post electrodes and the wiring traces; and a resin seal portion filling a space between the LSI region and the insulation tape, wherein, on the first main face, the plurality of wiring traces connected to the plurality of post electrodes are used as the wiring for external connection and on the second main face, tip ends of through electrodes formed to pass through the semiconductor substrate are used as the wiring for external connection, the insulation tape being connected to a support portion prior to applying the resin seal portion, the insulation tape being separated from the support portion after the resin seal is applied, wherein the semiconductor substrate and the resin seal directly contact the LSI region.

3. A method for manufacturing a chip-size double side connection package, the method comprising:

providing a semiconductor chip comprising a semiconductor substrate a LSI region and electrode connection regions, said LSI region being located on one side of said semiconductor chip;

providing a support portion, a plurality of wiring traces and a plurality of post electrodes, said plurality of wiring traces being connected to said plurality of post electrodes, said support portion being connected to said plurality of wiring traces and said plurality of post electrodes;

connecting said plurality of post electrodes to said electrode connection regions with a plurality of through electrodes and said wiring traces connected to said support portion, wherein a space is defined between said LSI region and said support portion;

applying resin into said space;

disconnecting said support portion from said wiring traces and said plurality of post electrodes after applying said resin, said plurality of wiring traces and said plurality of post electrodes being connected to said LSI region with said support portion disconnected from said wiring traces and said plurality of post electrodes, at least one or more of said wiring traces defining a first external wiring connection on said one side of said semiconductor chip and one or more ends of said through electrodes on another side of said semiconductor chip defining a second external wiring connection on said another side of said semiconductor chip, wherein an insulation tape is provided on a back side of said plurality of post electrodes, at least a portion of said insulation tape defining a portion of said space, said insulation tape being connected to said support portion prior to applying said resin, said insulation tape being separated from said support portion after said resin is applied, wherein said insulation tape forms a protection film of said semiconductor chip after said support portion is separated from said plurality of post electrodes and said wiring traces.

4. A method in accordance with claim 3, wherein said resin engages said LSI region, said plurality of post electrodes and said wiring traces.

* * * * *